United States Patent [19]

Smith

[11] Patent Number: 4,907,180

[45] Date of Patent: Mar. 6, 1990

[54] HARDWARE SWITCH LEVEL SIMULATOR FOR MOS CIRCUITS

[75] Inventor: Mark T. Smith, San Mateo, Calif.

[73] Assignee: Hewlett-Packard Company, Palo Alto, Calif.

[21] Appl. No.: 47,961

[22] Filed: May 4, 1987

[51] Int. Cl.⁴ .................... G06F 15/16; G01R 31/28
[52] U.S. Cl. ..................................... 364/578; 371/23
[58] Field of Search ............... 364/578; 371/23, 26

[56] References Cited

U.S. PATENT DOCUMENTS

| | | | |
|---|---|---|---|
| 4,527,249 | 7/1985 | Van Brunt | 364/578 |
| 4,587,625 | 5/1986 | Marino, Jr. et al. | 364/578 |
| 4,628,471 | 12/1986 | Schuler et al. | 364/578 |
| 4,725,971 | 2/1988 | Doshi et al. | 364/578 |

FOREIGN PATENT DOCUMENTS 231948 8/1987 European Pat. Off. ............ 364/578

OTHER PUBLICATIONS

Bryant, IEEE Transactions on Computers, vol. C-33, No. 2, Feb. 1984, "A Switch Level Model and Simulator for MOS Digital Systems", pp. 160-177.
Dally et al., IEEE Transactions on Computer-aided Design, vol. CAD-4, No. 3, Jul. 1985, "A Hardware Architecture for Switch-level Simulation", pp. 239-250.
Lin et al., IEEE Transactions of Computer-aided Design, vol. CAD-3, No. 4, Oct. 1984, "Signal Delay in General RC Networks", pp. 331-349.
Smith, Proceedings of the IEEE International Conference on Computer Design, 1985, "Adaptation of a Switch Level Model for Digital Circuits Utilizing Steering Logic", pp. 586-589.
Yamamoto et al., IEEE Transactions on Computer-aided Design, vol. CAD-4, No. 3, Jul. 1985, "Vectorized LU Decomposition Algorithms for Large-scale Circuit Simulation," pp. 232-238.

Primary Examiner—Felix D. Gruber
Attorney, Agent, or Firm—John A. Frazzini

[57] ABSTRACT

A hardware switch level simulator for LSI/VLSI MOS circuits capable of simulating circuits with pass transistors and performing timing analysis. The simulator has a stack memory containing lists of nodes to be operated on, a solve unit having programmed logic arrays for performing simulation steps using Bryant algebra plus an addition step for detecting unblocked paths to a controlling gate of a pass transistor, a traversal unit having gate memory storing a gate list of nodes for each transistor and having link memory storing a netlist of transistor switches with parameters such as preset transistor switch state, transistor strength, and pointers to nodes to which a transistor connects. A timing unit performs delay calculations. In order to simulate pass transistor circuits, the traversal unit has two sets of memory addressing gates. One set ordinarily accesses link memory, while a second set ordinarily addresses gate memory. During source to gate path detection, the second set can be multiplexed to also address link memory.

10 Claims, 4 Drawing Sheets

Microfiche Appendix Included
(1 Microfiche, 42 Pages)

| CONTROL GATE LOGIC STATE | CONDITIONS $V_{gs}$ DETERMINATION | | SWITCH STATE | | |
|---|---|---|---|---|---|
| | | | NMOS DEF | NMOS ENH | PMOS ENH |
| 0 | $V_{gs} \gg V_{th}$ | | ON | ON | ON |
| 1 | $V_{gs} \gtrsim V_{th}$ | | ON | OFF | ON |
| X | $V_{gs} \gtrsim V_{th}$ | | ON | INDETERMINATE | |
| ANY | $V_{gs} < V_{th}$ | | OFF | OFF | OFF |

HARDWARE SWITCH LEVEL SIMULATOR FOR MOS CIRCUITS

REFERENCE TO MICROFICHE APPENDIX

A microfiche appendix is included in the application. One microfiche having forty one frames of computer program listings appear in the microfiche appendix.

TECHNICAL FIELD

The present invention relates to MOS transistor circuit simulators for use in testing integrated circuit designs.

BACKGROUND ART

Switch level simulation of digital circuits is an important design verification tool for designers of MOS integrated circuits. However, switch level simulation software running on a general purpose computer can take days to accomplish an exhaustive simulation on a large circuit of about 100,000 transistor devices. As the complexity of VLSI circuits increases, the time and cost to perform a complete software simulation on a general purpose computer is becoming prohibitive. One approach being developed is the construction of hardware specifically designed to handle switch level simulation of MOS transistor circuits. Performance factors which are important include not only speed, but also capacity to load and process large netlists corresponding to realistic LSI/VLSI circuit designs, timing analysis capability in addition to unit delay simulation, the ability to handle commonly used circuit design techniques, such as steering or pass transistor logic, and accuracy. The hardware simulator must be based on an algorithm that is sufficiently accurate to be useful, yet not so complex as to be unable to be put into hardware.

In IEEE Transaction of Computers, vol. C-33, no. 2, February, 1984, pp. 160–177, Bryant describes a switch level model that has been developed to describe the logical behavior of MOS transistor circuits, and then describes an algorithm for a logic simulator based on the model. A hardware architecture for implementing this algorithm is described by Dally and Bryant in IEEE Transactions on Computer-Aided Design, vol. CAD-4, no. 3, July, 1985, pp. 239–250.

In the model a network consists of a set of nodes connected by transistor switches. Each node has a state 0, 1 or X representing low, high and invalid voltages. Likewise, each transistor has a state 0, 1 or X representing open (nonconducting or OFF) closed (conducting or ON) and indeterminate conditions. Input nodes, including power and ground nodes, as well as any clock or data inputs, provide signals to the system and are not affected by the actions of the network. Storage nodes have states determined by the operation of the network, and these states remain on the nodes in the absence of applied inputs. Each storage node is assigned one of a number of discrete size values $K_1, \ldots, K_{max}$ that indicates its approximate capacitances in relation to other nodes. Each transistor has a strength $\gamma_1, \ldots, \gamma_{max}$, indicating its conductance when closed relative to other transistors which may form part of a ratioed path.

The algorithm simulates the behavior of a circuit by taking a series of unit steps, where within each step the new excitation states of the nodes, i.e. the steady-state response of the nodes for an initial set of nodes states when the transistors are held fixed in states determined by the states of their gate nodes, are computed and the nodes are updated to their new states. This is done repeatedly until either a stable state is reached or a user defined step limit is exceeded. Determining the new excitation states is a four step process comprising a "logic update" step, a "perturbation" step, a "blocking strength" step and a "up/down" step. During the "logic update" step, the conduction states of the transistors whose gate nodes have changed state in the last node update are updated, and the source and drain nodes of these transistors are queued for the next step. During the "perturbation" step, the set of all nodes that could be affected by the changing transistor states are found by starting at the nodes queued in the logic update step and traversing the links representing transistors in the 1 or X state. Each time a new node is encountered, it is added to the queue. The "blocking strength" step determines the strength of the strongest definite path to each node in the queue, a path being definite if none of its edges correspond to transistors in the X state, and the strength of a path being defined as the minimum of the size of the root node and the strengths of the transistors corresponding to the path edges, where strength values are ordered $K_1 < \ldots < K_{max} < \gamma_1 < \ldots < \gamma_{max} < \omega$. The "up/down strength" step computes the up (respectively, down) value for each node, i.e. the strength of the strongest unblocked path to the node having a root node with state 1 or X (respectively, 0 or X). If no such path exists, the value is set to 0. Once this computation terminates the steady-state response of the node equals 1 if the down value equals 0, 0 if the up value equals 0, and X otherwise. This algorithm just described will henceforth be called the "Bryant algebra".

The Bryant algebra and the Dally and Bryant hardware architecture which implements the algebra does not deal with MOS circuits employing pass transistors. In that architecture an enhancement device is considered to be ON if the gate has the correct logic level, even if the gate and source are shorted. In this case, the gate to source voltage $V_{gs}$ would be zero and would be less than a positive threshold voltage $V_{th}$. Thus, the transistor would in fact be OFF.

A limitation of other prior art simulators is that they are adapted to perform only in a unit delay mode and thus cannot do timing analysis. In some circuits, a proper prediction of behavior requires delay times to be taken into account.

In IEEE Transactions on Computer-Aided Design, vol. CAD-3, no. 4, October, 1984, pp. 331–349, Lin and Mead disclose a method for determining a single value of Elmore's delay for any node changing state in a general RC network. The effects of parallel connections and initial stored charges on nodes are taken into consideration. A simulation algorithm based on Bryant's algebra is described.

In Proceedings of the IEEE International Conference on Computer Design 1985, pp. 586–589, Smith discloses a simulation algorithm which accurately predicts the behavior of MOS transistor circuits including pass transistors. Smith modifies the "up/down strength" step of the Bryant algebra for MOS transistor circuits including pass transistors to determine if there is an unblocked path between gate and source node of a transistor.

It is an object of the present invention to produce a hardware switch level simulator for MOS transistor circuits which is able to accurately simulate the behavior of circuits using pass transistors.

It is another object of the invention to produce such a hardware simulator which is also fast, has the capacity to handle realistic VLSI circuit designs, and offers the option of performing timing analysis in addition to unit delay simulation.

DISCLOSURE OF THE INVENTION

The above objects have been met with a hardware switch level simulator using a modified Bryant algebra for accurately performing unit delay and timing simulation of VLSI MOS transistor circuits including pass transistors. The simulator includes a traversal unit having a link memory storing a netlist of transistor switches with parameters such as identification of the source and drain nodes with which a transistor switch connects, the transistor's current switch state, and the transistor switch's predetermined strength. The traversal unit also includes a gate memory storing a gate list of nodes identifying the transistor switches whose gates are connected to said nodes. The simulator also includes a solve unit having a node memory storing a node list of all nodes in a circuit, together with parameters such as whether a node is a member of a specific set in a stack memory, identification of netlist and gate list entries containing that node, the node's current logic state, and strengths of the node and of the dominant charging path to the node. The solve unit also includes programmed logic arrays which communicate with the various link, gate, node and stack memories and perform the Bryant algebra simulation steps.

In order to accurately simulate the behavior of circuits with pass transistors, a SOLVE_O programmed logic array detects the condition where the gate to source voltage $V_{gs}$ is less than the threshold voltage $V_{th}$, by determining whether an unblocked path exists from the source node to a controlling gate node of a pass transistor However, since SOLVE_O is called from within the "up/down strength" step SOLVE_U/D in the modified Bryant algebra, the gate memory addressing circuitry in the traversal unit is capable of being multiplexed into link memory to retrieve netlist information corresponding to transistor switches and nodes for use by the SOLVE_O programmed logic array.

The simulator may also include a timing unit with programmed logic arrays for performing capacitance and delay calculations for nodes changing state in a circuit. The node memory of the solve unit includes parameters for use in the timing calculations, such as cumulative capacitance and delay at each node and identification of the adjacent node upstream in the charging path, the stack unit can store multiple lists of nodes being updated for each time delay calculated in time analysis.

BEST MODE FOR CARRYING OUT THE INVENTION

Figure 1:
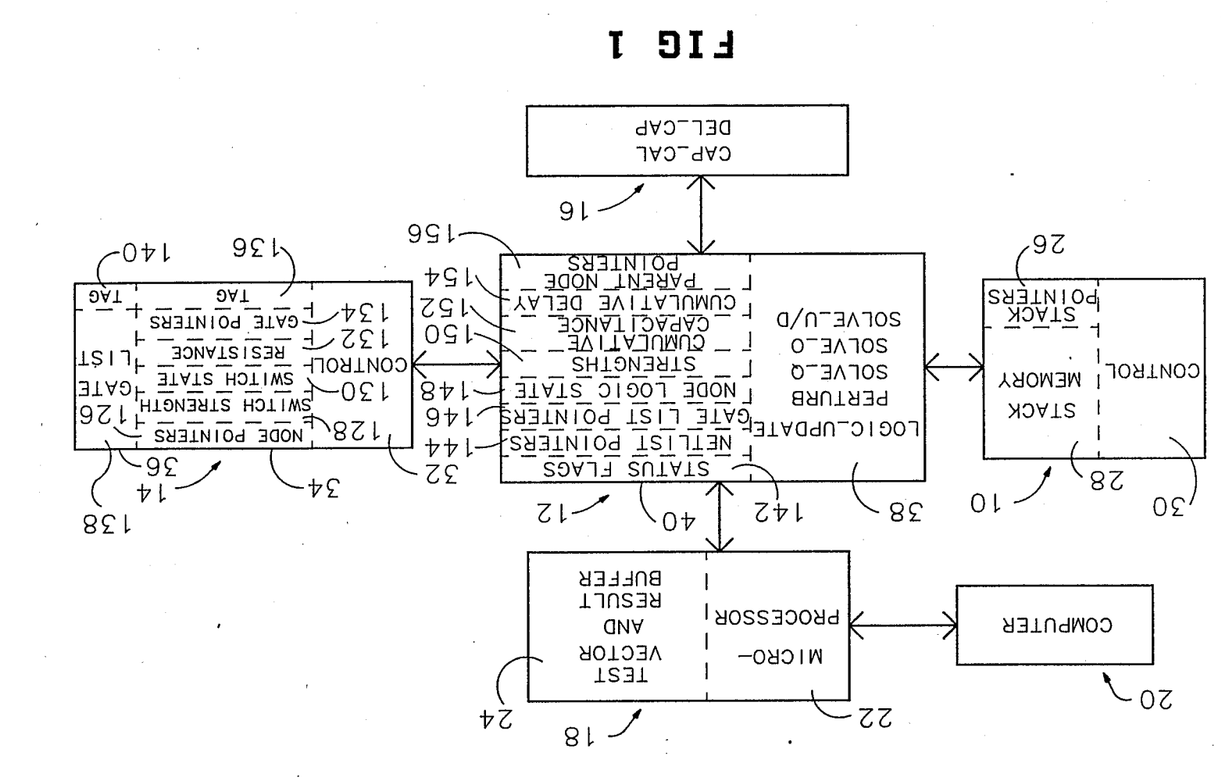
FIG. 1 is a block diagram of the hardware switch level simulator of the present invention together with a host computer and host controller communicating with the simulator.

With reference to FIG. 1, a hardware switch level simulator includes a stack unit 10, a solve unit 12, a traversal unit 14 and a timing unit 16. Stack unit 10, solve unit 12 and traversal unit 14 are all used for unit delay simulation. Timing simulation involves the above named units 10, 12 and 14 with the addition of timing unit 16. Typically, the simulator is built using TTL logic and all memory units are standard dynamic random access memory devices, each typically having 256 K of storage locations.

A host controller 18 provides an interface between the simulator and some host computer 20, such as a Hewlett Packard 9000-320 computer. This interface allows the host computer 20 to load various lists, derived from a MOS transistor circuit and necessary for the simulator to operate, into the various memory units of the simulator. The interface also allows the host computer 20 to load test vectors and read returned data. A second function of host controller 18 is to control the actions of the simulator by causing it to run as directed by the host computer 20, and to interpret the operating status of the simulator and return this status information to the host computer 20. Host controller 18 comprises a microprocessor 22, such as the commercially available Zilog Z-80 microprocessor, and a buffer 24. Buffer 24 allows test vector and returned data to be temporarily stored, thus reducing the amount of time the simulator waits for host computer interaction. Host controller 18 can also perform some memory list building and other managerial tasks related to simulation that would ordinarily burden the host computer 20. Host controller 18 handles data exchange between computer and simulator. The controller is not essential and computer 20 may interact directly with the simulator if controller is eliminated.

In the unit delay mode, the simulator performs the following algorithm. Details can be found in the Bryant reference noted above as modified by Smith, also referenced above.

```
if L_SET[0] not empty, do                    (1)
begin
  for each node in L_SET[0]
    LOGIC_UPDATE (node)
  for each node in P_SET
    PERTURB (node)
  for x := ω, γ7, . . . , K₁ do
  begin
    for each node in R_SET[x]
      SOLVE_Q (node)
  end
  for x := ω, γ7, . . . , K₁ do
  begin
    for each node in U_SET[x]
      SOLVE_U/D (node)
  end
end.
```

Briefly, the algorithm operates on sets of nodes L_SET(0), P_SET, R_SET(x) and U_SET(x) stored in stack unit 10. The procedures LOGIC_UPDATE, PERTURB, SOLVE_Q and SOLVE_U/D are performed by hardware functional units in solve unit 12 using various data from stack unit 10 and traversal unit 14. The algorithm is executed repeatedly until a stable state is reached or until the number of repeat steps exceeds a user defined limit.

Figure 4:
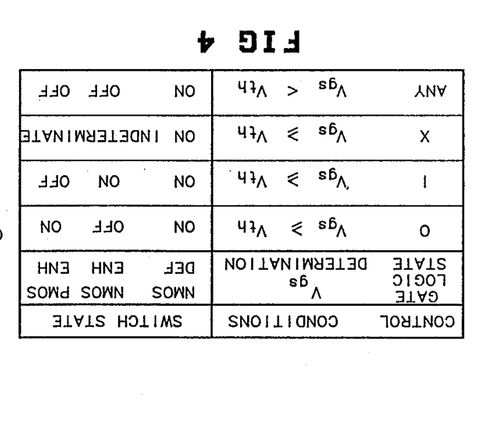
FIG. 4 is a state table indicating the resulting switch states for various transistor types, gate logic states and source-ground voltage determinations.
Figure 4A:
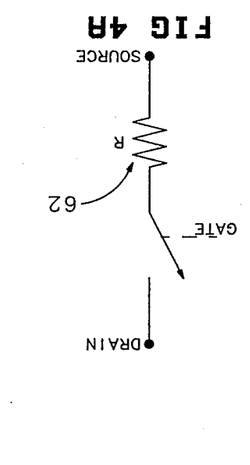
FIG. 4A is a simplified MOS transistor model.

With reference to FIGS. 4 and 4A, a transistor 62 is represented as a switch consisting of a drain and a source serving as connection ports, and a gate which serves as a control port. When the switch is OFF, it is assumed to have an infinite resistance from source to drain, and when it is ON, it is assumed to have some fixed resistance R that is normally a function of the transistor type and its internal geometry. The simulation algorithm uses this resistance R in the determination of the strength $\gamma_1, \ldots, \gamma_7$ of a charging path to a node, where a device's resistance is inversely proportional to its ON resistance. The manner in which the gate controls the transistor's switch state is shown in FIG. 4 for NMOS depletion, NMOS enhancement, and PMOS enhancement devices.

Figure 5:
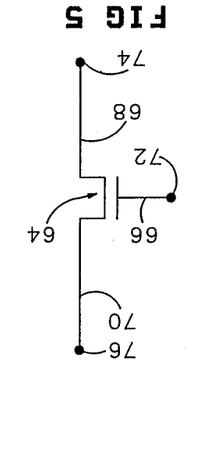
FIGS. 5-9 are schematic diagrams of MOS circuit portions illustrating the various steps in Bryant algebra.

In FIG. 5, a transistor 64 has a gate 66, a source 68 and a drain 70. Gate 66 connects to a node 72, source 68 connects to a node 74 and drain 70 connects to a node 76. The function of the LOGIC_UPDATE procedure is to identify nodes which may be affected by a change in the state of a gate node 72 driven during the previous step, and then to queue these nodes into a node list for further investigation. In order to identify these nodes, information is needed on the source and drain nodes, 74 and 76 that belong to the transistor 64 whose gate 66 is being driven. As is discussed below, this gate traversal information is provided by a gate list stored by traversal unit 14. L-SET [0] is the set of nodes driven in the previous step and the identified source and drain nodes are stored in the set P_SET.

Figure 6:
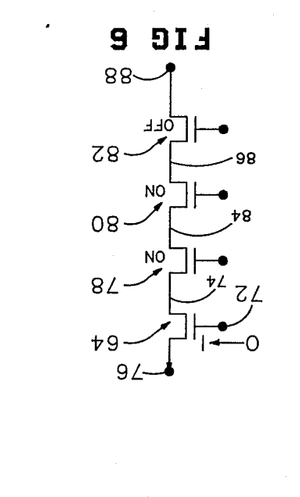

In FIG. 6, transistors 64, 78, 80 and 82 are connected together at nodes 74, 84 and 86. In order to determine the complete effect of a state change at gate node 72 of transistor 64, it is next necessary to perform a link traversal, i.e. to find the set of all nodes that could be affected, by starting at the nodes 76 and 74 in P_SET queued in the LOGIC_UPDATE procedure and adding into the queue those nodes 84 and 86 traversed from node through transistors 78 and 80 in the ON state. Node is not added since transistor 82 is OFF. This procedure, called PERTURB, requires information on the source and drain nodes to which a transistor connects as well as the transistor's current switch state. As is discussed below, this link traversal information is provided by a netlist stored by traversal unit 14. The resulting list of nodes is then sorted by node strength into separate lists R_SET(x).

Figure 7:
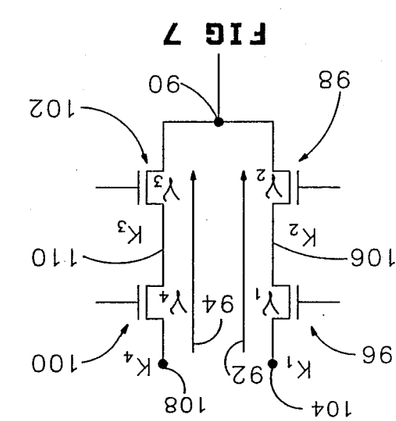

In FIG. 7, the blocking step performed by procedure SOLVE_Q, determines the effect on a node 90 from two unblocked paths 92 and 94 of unequal charging strength. Path 92 begins at node 104 of strength $K_1$, traverses transistor 96 of strength $\gamma_1$, to node 106 of strength $K_2$, and traverses transistor 98 of strength $\gamma_2$ to node 90. Path 94 begins at node 108 of strength $K_4$, traverses transistor 100 of strength $\gamma_4$ to node 110 of strength $K_3$, and traverses transistor 102 of strength $\gamma_3$ to node 90. SOLVE_Q acts on nodes in order of strength, strongest nodes first in order to identify the path with the greatest minimum of the size of the root node 104 or 108 and transistor sizes in the path. Thus, path 94 is identified as the dominant path. Information on transistor strengths is provided by the netlist in traversal unit 14. Node strength information is stored and retrieved from a node list in solve unit 12.

Figure 8:
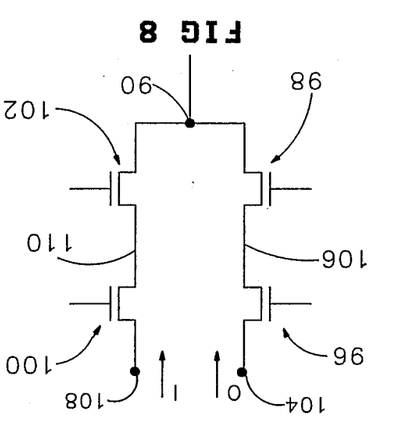

With reference to FIG. 8, the procedure SOLVE_U/D computes the up and down strengths for each node. The up strength of a node is the strength of the strongest unblocked path to the node having a root node with state 1 or X. If no such path exists, the strength is set to 0. Likewise, the down strength of a node is the strength of the strongest unblocked path to the node having a root node with state 0 or X. The up and down strengths are compared to determine the resulting node value. If the up and down strengths are equal, the resulting node value is indeterminate (X). In FIG. 8, the two paths from FIG. 8 leading to node 90 are compared. The up strength is the strength K of root node 108 with state 1. The down strength is the strength K of root node 104 with state 0. The resulting state of node 90 is therefore 1.

The procedure SOLVE_O that is used in the simulation of circuits with pass transistors is called from procedure SOLVE_U/D as shown in the algorithm below. SOLVE_O is discussed in detail in the Smith reference noted above.

```
procedure SOLVE_U/D                                    (2)
begin
while U_SET[x] not empty do
begin
node := pop(U_SET[x]);
if not node.done then
begin
node.done := true;
for each trans ε node.storageconset do
begin
SOLVE_O(node,gate.node);
if not dev.off then
begin
if node = trans.node1
then xnode := trans.node2
else xnode := trans.node1;
uval := min(node.u,trans.strength);
dval := min(node.d,trans.strength);
if trans.state = 1 and (uval>xnode.u or dval>xnode.d) then
begin
if uval>xnode.u then xnode.u := uval;
if dval>xnode.d then xnode.d := dval;
push(U_SET[max(xnode.d,xnode.u)],xnode);
if xnode.state changed then push(L_SET[0],xnode);
    end
    end
    end
    end
    end
  end.
procedure SOLVE_O(node,gate.node)                       (3)
begin
node.done'(node) := false;
dev.off(node) := false;
mode.q := node.size;
if trans.type = enhancement
then begin
put (L[A],node);
while L[A] ≠ 0 do
begin
xnode:= get(L[A]);
if not node.done'(xnode)
then begin
node.done'(xnode) := true;
put (L[done],xnode);
for each trans ε node.storageconset do
begin
if xnode = trans.node1
then ynode := trans.node2
else ynode := trans.node1;
qval := min(xnode.q,trans.strength);
if trans.state = 1 and ynode.q ≦ qval
then begin
if ynode = gate.node
then begin
dev.off(node) := true;
while L[A] ≠ 0 get(L[A]);
end
```

-continued

```
        else
          put(L[A],ynode);
        end
      end
    end
  end
  while L[done] ≠ 0 do
    begin
      xnode = get(L[done]);
      node.done'(xnode) := false;
    end
end.
```

Figure 9:
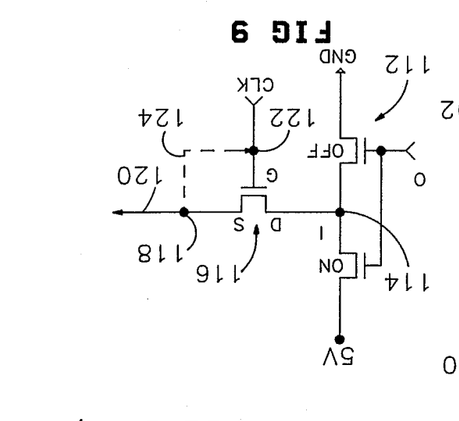

In FIG. 9, an inverter circuit 112 with input state 0 and output state at node 114 of 1 traverses a pass transistor 116 to a source node 118. When pass transistor 116 is ON it will pass the value at node 114 to source node 118 for an output 120 of state 1. Normally, this will occur when gate node 122 of pass transistor 122 is at logic state 1, i.e. when the clock value is at state 1. However, as seen in the table in FIG. 4, when source node 118 is connected via a dominant unblocked path 124 back to gate node 122, the gate-to-source voltage $V_{gs}$ will equal zero, and may be less than a threshold voltage $V_{th}$. In this case, an enhancement transistor will be OFF even though the gate logic state would indicate otherwise. Accordingly, procedure SOLVE_O attempts to locate any unblocked path from a gate node of a pass transistor to the source node.

Referring again to FIG. 1, stack unit 10 comprises a number of registers 26 serving as stack pointers, a stack memory 28 and a control subunit 30 for managing the various node sets stored in stack memory 28. A large common pool of memory 28 stores numerous sets of nodes L_SET ($\tau$), P_SET, R_SET(x) and U_SET(x) to be operated on during the various steps taken during simulation. Typically, about 512K storage locations are provided. Stack pointer registers 26 indicate which node set is to be used with each procedure. Stack control 30 dynamically allocates as much memory as is needed. Stack control 30 includes a finite state machine, which typically consists of three programmed logic arrays, as well as some input and output registers. Computer program listings for a stack unit state machine is provided in the microfiche appendix included herewith.

The node set L_SET($\tau$) holds nodes for use in the LOGIC_UPDATE procedure. In the case of unit delay, one stack L_SET (0) is used. In the timing mode, 1024 stacks can contain nodes, each stack corresponding to a position of a 10 bit time pointer in timing unit 16. During the PERTURB procedure, nodes are pulled from an input set P_SET and pushed to any of 15 separate sets R_SET(x) sorted by node strength which are to be used as input sets for the SOLVE_Q procedure. There are 15 sets because there are 15 total strength levels $K_1, \ldots, K_7, \gamma_1, \ldots, \gamma_7, \omega$ corresponding to all possible transistor and node strengths. If a different number of discrete strengths is used, the number of node sets R_SET(x) will correspond to that different number. During execution of the SOLVE_Q procedure, nodes are acted upon only in order of strength, the strongest set R_SET($\omega$) being acted on first and the weakest set R_SET($K_1$) being operated on last. Likewise, the procedure SOLVE_U/D acts on the sets U_SET(x) in order of node strength from strongest to weakest. Within a certain strength level, no particular order for node consideration is necessary, so the sets can be arranged in simple stacks.

Traversal unit 14 comprises a control subunit 32, a link memory 34 and a gate memory 36. Traversal unit 14 stores two general lists of data, a netlist stored in link memory 34 and a gate list stored in gate memory 36. Control subunit 32 typically comprising one or more programmed logic arrays together with input and output registers, communicates with solve unit 12 and loads and retrieves data from link memory 34 and gate memory 36 as they are requested. A computer program listing for the traversal unit state machine, i.e. programmed logic arrays, is included in the microfiche appendix herewith.

The netlist (node.storageconset in algorithm (2) above) stored in link memory 34 is a list of transistor switches containing information in a record with a plurality of fields indicating each transistor's connections to various nodes by its gate, source and drain. Among the information included in each entry are NODE POINTERS 126 (x.node) which point to the nodes connected to by the transistor source and drain. SWITCH STRENGTH 128 (trans.strength) indicates the transistor's predetermined strength. SWITCH STATE 130 (trans.state) indicates the transistor's current switch state, i.e. whether the transistor is ON, OFF or whether the state is INDETERMINATE. RESISTANCE 132 indicates the transistor's predetermined ON resistance used in determining delay in the timing analysis mode. GATE POINTERS 134 (gate.node) indicate the node to which the transistor's gate is connected. Each netlist entry is preferably stored in sequential traversal unit memory addresses, making pointers to the next list entry unnecessary. A TAG 136 in the list identifies when an element is the last transistor switch listed.

The GATE LIST 138 stored in gate memory 36 identifies those transistor switches that could be affected by changing the gate logic level of interest, i.e. those transistors whose gate connects to the node being driven. The gate list comprises pointers to transistors in the netlist and therefore to appropriate drain and source node identification. Each gate node entry is arranged in a sequential manner, and a TAG 140 in the GATE LIST 138 identifies the last element in the list. The gate list is only used during the LOGIC UPDATE procedure and ensures that only active portions of a circuit are operated on thereby providing more efficient simulation. As is discussed below, circuits ancillary to the gate memory 36 can be converted into a second group of circuits 52 ancillary to the link memory 34 during operation of the SOLVE _O procedure.

Solve unit 12 communicates directly with all other units 10, 14, 16 and 18, and is involved in executing all of the simulation procedures LOGIC_UPDATE, PERTURB, SOLVE_Q, SOLVE_U/D and SOLVE_O. Solve unit 12 comprises a simulation step subunit 38 an a node memory 40.

Node memory 40 stores a node list containing entries for every node in a circuit. Typically, up to 256K entries may be stored. Each node list entry contains a plurality of parameters arranged in fields. STATUS FLAGS 142 indicate conditions, such as whether a particular node is a member of a particular set stored in stack memory 28. Typically, there may be as many as 8 status flags. NETLIST POINTERS 144 indicate transistor switches in the netlist in link memory 34, in which the source or drain thereof connects to a particular node. Likewise, GATE LIST POINTERS 146 indicate transistor switches in the gate list in gate memory 36, in which the gate thereof connects to the node. NODE LOGIC STATE 148 gives the node's current logic value. STRENGTHS 150 indicate strengths currently associated with the node, such as the intrinsic node strength, as well as strength currently associated with the dominant charging path to the node, such as blocking strength, up strength and down strength. CUMULATIVE CAPACITANCE 152, CUMULATIVE DELAY 154 and PARENT NODE POINTERS 156 are associated with timing analysis and are discussed below.

Figure 2:
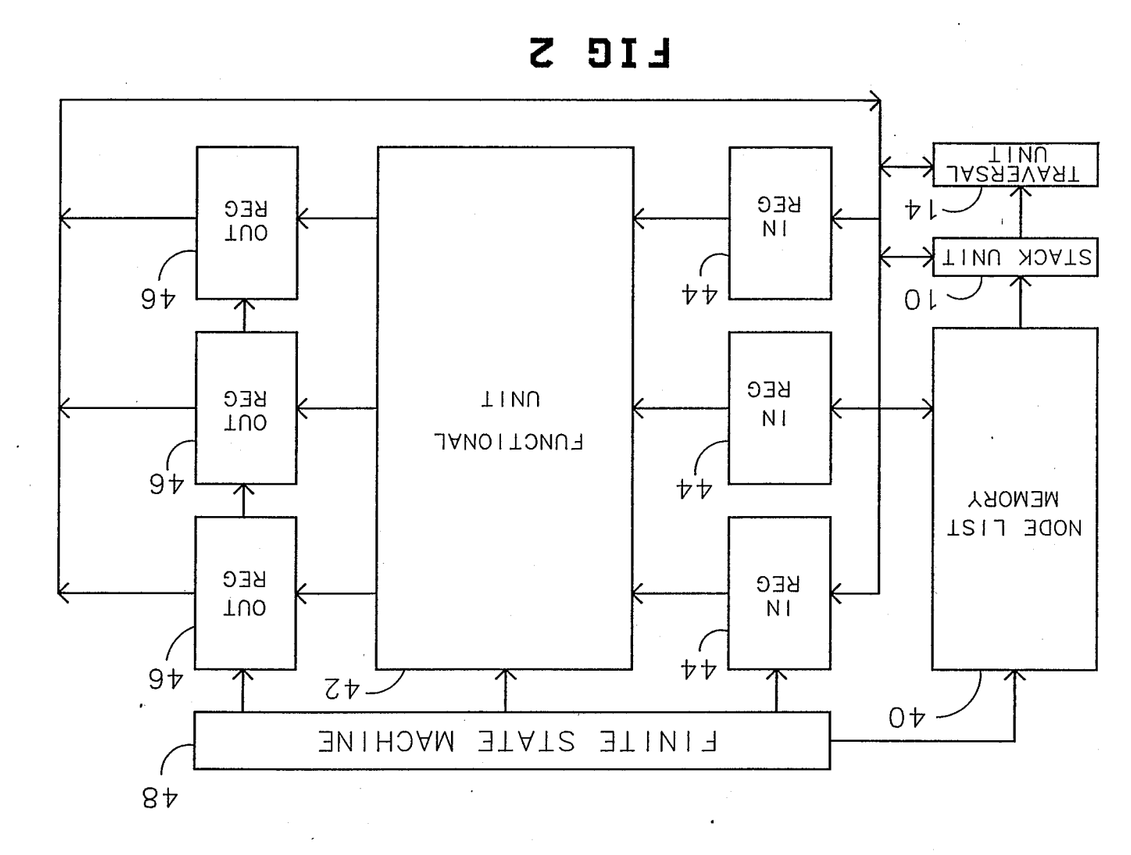
FIG. 2 is a block diagram of a functional section of the solve unit in the simulator of FIG. 1 dedicated to a single step in the Bryant algebra.

Referring to FIG. 2, the simulation step subunit 38 is made up of a number of functional units 42, each of which is dedicated to a specific one of the procedures. There are many steps involved in performing a complete circuit simulation, but most of the functionality encountered during execution involves reading strengths and other data from the node list in node memory 40 for nodes indicated by stack and traversal units 10 and 14 respectively. Other data may be retrieved from traversal unit 14, if necessary.

Node memory 40, stack unit 10 and traversal unit 14 can be read and the information transferred to a functional unit 42 via input registers 44 connected to functional unit 42 and units 10, 14 and 40. The data is then processed by a functional unit 42, typically comprising one or more programmed logic arrays, designed to perform the desired calculation, such as PERTURB or SOLVE_Q. New strengths and other data are buffered out of the functional unit 42 via output registers 46 connected to functional unit 42 and memory units 10, 14 and 40 and written back into the desired memory structure, usually node memory 40. A finite state machine 48 controls the interaction of functional units 42 and registers 44 and 46 with the various memory structures 10, 14 and 40. A computer program listing for the programmed logic arrays in solve unit 12 is included in microfiche appendix herewith.

Figure 3:
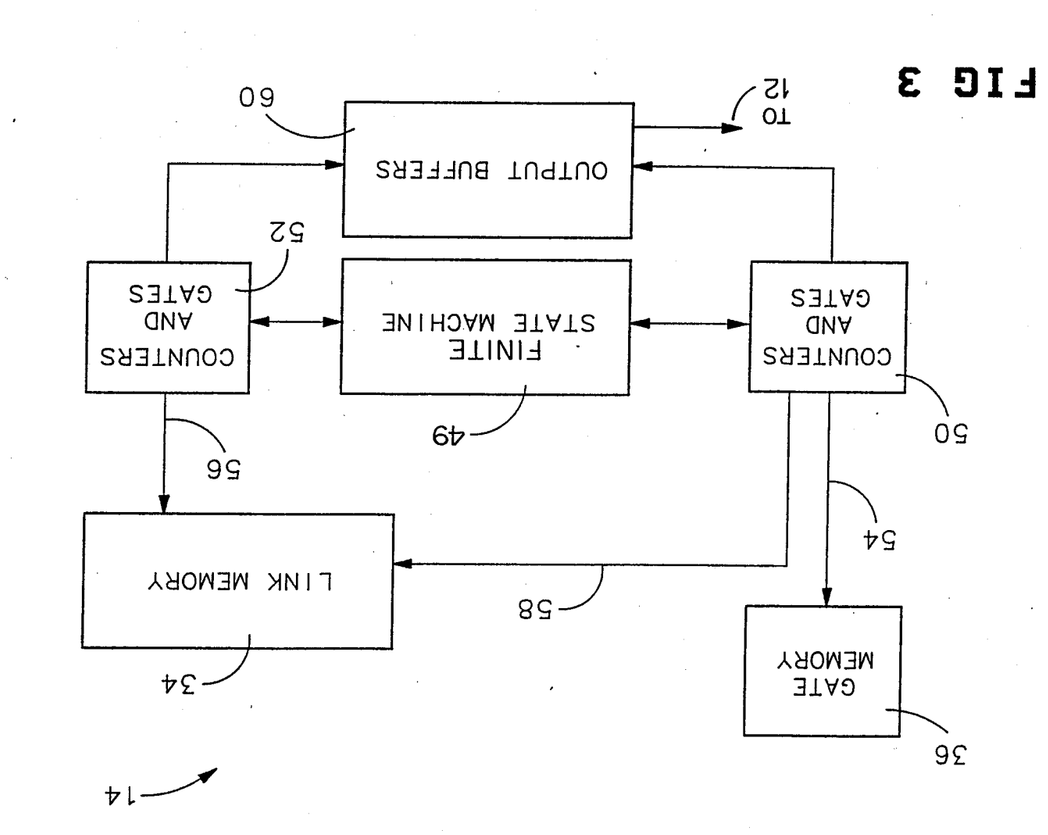
FIG. 3 is a block diagram of the traversal unit in the simulator of FIG. 1.

With reference to FIG. 3, the procedure SOLVE_O, which is used to determine the presence of an unblocked path back to a controlling gate in a pass transistor circuit, presents a special problem for the traversal unit. As noted in procedure (2) above, SOLVE_O is called from SOLVE_U/D. Thus, there can be two netlist link traversals occuring at the same time, one for each SOLVE procedure. It is necessary that traversal unit 14 have a way of restarting the link traversal for the SOLVE_U/D procedure each time SOLVE_O finishes. In other words, the traversal unit 14 must be capable of performing two link path traversals without getting the two mixed up. To do this the traversal unit 14 has a state machine 49 common to both link and gate memories 34 and 36 and two sets of memory access counters and gates 50 and 52, one of which can be switched to access link memory 34. An output buffer 60 returns requested data to solve unit 12.

Normally, gate traversal information is needed only during the LOGIC_UPDATE procedure, while link traversal information is needed the remainder of the time. State machine 49 switches between access to gate memory 36 via memory access counters and gates 50 and access to link memory 34 via the second set of memory access counters and gates 52. Counters and gates 50 are normally set by a gate list pointer received from solve unit 12 by state machine 49 so as to access the appropriate gate list data location in gate memory 36 via a first bus 54. Likewise, counters and gates 52 are normally set by a netlist pointer received from solve unit 12 by state machine 49 so as to access the appropriate netlist data location in link memory 34 via a second bus 56. During a SOLVE_O procedure, state machine 48 can trace a second link pathway be setting counters and gates 50, normally dedicated to access to gate memory 36, with a netlist pointer corresponding to the second link pathway, and by accessing the appropriate data location in link memory 34 via a third bus 58. Thus, traversal unit 14 allows counters and gates 50 to be multiplexed for access to link memory 34, so that pointers in second counters and gates 52 can be retained and restarted after completion of the SOLVE_O procedure. In effect, counters and gates 50 replicates the function of second counters and gates 52 to create two simultaneous accesses to link memory 34.

We have so far discussed the simulator in the unit delay mode. The general algorithmic flow for timing simulation is the following:

--- if L_SET[r] is not empty for any time r, do  (4)
begin
if L_SET[r] not empty, do
begin
for each node in L_SET[r]
LOGIC_UPDATE(node)
for each node in P_SET
PERTURB(node)
for x := ω,γη, . . . ,k₁ do
begin
for each node in R_SET[x]
SOLVE_Q(node)
end
for x := ω,γη, . . . ,k₁ do
begin
for each node in U_SET[x]
SOLVE_U/D(node)
end
x := 1;
if C_SET[1] not empty or C_SET[2] not empty then
begin
for each node in C_SET[x]
CAP_CAL(node)
if x = 1 then x := 2
else x := 1;
end
for each node in D_SET
DEL_CAL(node)
end
end
r := r + 1 mod 1024;
end.

---

Referring again to FIG. 1, a timing unit 16 keeps a pointer to time. Stack unit 10 can store a circular queue of 1024 stacks referred to as L_SET(τ), where τ can take on values between 0 and 1023. The simulator finds the dominant paths to nodes in the same manner as in unit delay, except that in procedure SOLVE_U/D, rather than placing nodes that have changed state back into a L_SET, it assigns pointers to all nodes along dominant paths connecting nodes that may change. These PARENT NODE POINTERS are stored in node list 40 of solve unit 12, and point back through a switch to the adjacent node upstream in the charging path. The last node in the path, one having no pointer referring to it, is called the leaf node, while all others are called parent nodes. SOLVE_U/D places all leaf nodes into a C_SET(1) in stack unit 12. Control is then passed to timing unit 16 where the procedures CAP_CAL and DEL_CAL are performed. The procedures CAP_CAL and DEL_CAL are described in detail in the Lin and Mead reference noted above.

Briefly, CAP_CAL traces along a path starting from the leaf node, determining the effective capacitance at each node, and solving for a resultant cumulative capacitance which is the sum of the node's effective capacitance and the cumulative capacitance of the previous node. The effective capacitance is defined as:
if node.state has changed
   then effective.capacitance: = node.size
   else effective.capacitance: = 0;
CUMULATIVE CAPACITANCE 152 for each node is stored in node memory 40 of solve unit 12. CAP_CAL continues until the final parent node of each path is encountered.

A procedure DEL_CAL is then performed by timing unit 16, operating in the reverse direction on each path from CAP_CAL. DEL_CAL calculates the cumulative delay for each node, which is defined as the cumulative delay of the parent node added to the product RC. R is the predetermined resistance of the transistor switch connecting the node to the parent node, and is supplied by RESISTANCE 132 in the link memory 34 of traversal unit 14. C is the previously calculated CUMULATIVE CAPACITANCE 152 for the node stored in node memory 40. CUMULATIVE DELAY 154 for each node is stored in node memory 40. DEL_CAL continues for each path until the leaf node is reached, adding each node the changes logic state to L_SET [$\tau$+CUMULATIVE DELAY]. Timing unit 16 then increments time $\tau$ and returns control back to solve unit 12 for the next Bryant algebra step.

The hardware switch level simulator is faster than software simulators executed on a general purpose computer. Typically, the hardware simulator of the present invention averages 13,200 gate evaluations per second (GEPS) in unit delay and 9500 GEPS in timing mode. By comparison, the software MOSSIM II on a VAX 11-780 computer runs at about 500 GEPS. Further, the simulator accurately simulates the behavior of circuits using pass transistors and the delay calculations by timing simulation are generally within 20% to 40% of those calculated by the software SPICE. Because dynamic RAM is used, the simulator can accommodate a circuit of up to 262,144 MOS devices. Larger amounts of memory can be used to handle larger circuits.

We claim:

1. In a computer system for MOS transistor circuit simulation using Bryant algebra for calculating unit delay and performing timing simulation the improvement comprising,
   first memory means for storing gate parameters of transistors in a VLSI circuit, including pass transistors, said parameters including identification of transistors whose gates are connected to each node of said circuit,
   second memory means for storing path information of said VLSI circuit, including identification of nodes connected to a source and drain of each transistor, a switch state for each transistor and a switch strength for each transistor,
   control means communicating with said first and second memory means for retrieving information stored in said first and second memory means, said control means including first gate means for retrieving information in said second memory means and second gate means multiplexed for retrieving information in either one of said first and second memory means,
   solve means communicating with the control means for detecting unblocked paths to a controlling gate of each pass transistor.

2. The computer system of claim 1 wherein said solve means detects the condition $V_{gs} < V_{th}$ for pass transistors where $V_{gs}$ is equal to gate to source voltage for an MOS transistor and $V_{th}$ is equal to the threshold voltage for said MOS transistor.

3. A hardware switch level simulator for MOS transistor circuit simulation comprising,
   stack memory means for storing a plurality of sets of nodes to be operated upon,
   link memory means for storing information relating to each transistor in an MOS transistor circuit, including pass transistors, said information including identification of nodes connected to a drain and source of each transistor, a switch state of each transistor and a switch strength of each transistor,
   gate memory means for storing information relating to each node connected to a transistor gate, said information including identification of transistors whose gates connect to each node,
   node memory means for storing information relating to each node in said MOS transistor circuit, said information including pointers to information stored in said link memory means relating to transistors identifying each node and to information stored in said gate memory relating to each node, a node state of each node, an intrinsic node strength of each node and strength information associated with a path to each node,
   control means communicating with said stack, link, gate and node memory means for retrieving information stored in said stack, link, gate and node memory means, said control means including a first gate communicating with said link memory means and a second gate mulitplexed to communicate to either one of said gate memory means and link memory means, and
   solve means communicating with said stack, link, gate and node memory means via said control means for performing Bryant algebra simulation steps on said sets of nodes, said solve means including means for detecting the condition $V_{gs} < V_{th}$ for MOS pass transistors in said circuit, where $V_{gs}$ is a gate to source voltage for said pass transistor and $V_{th}$ is a threshold voltage for said pass transistor.

4. The simulator of claim 3 wherein said means for detecting the condition of $V_{gs} < V_{th}$ comprises means for detecting unblocked paths to a controlling gate of each pass transistor.

5. The simulator of claim 3 further comprising means for performing timing simulation of said MOS transistor circuit, said a plurality of sets of nodes in said stack memory means corresponding to different time positions, said link memory means storing information on a predetermined ON resistance for each transistor, said node memory means storing information on cumulative capacitances and delays for each node, said node memory means also storing pointers to parent node of each node.

6. The simulator of claim 3 wherein said memory means are dynamic random access memory.

7. The simulator of claim 3 wherein said solve means include means communicating with a computer interfacing circuit for receiving information to be stored in said memory means from said computer interfacing circuit relating to said MOS transistor circuit and for receiving information relating to initial test conditions for said circuit, and for sending simulation results to said computer interfacing circuit.

8. A hardware switch level simulator comprising a solve unit having a plurality of programmed logic arrays for performing Bryant algebra simulation steps for an MOS transistor circuit including detection of an unblocked path to a controlling gate of a pass transistor, said solve unit also comprising a node memory storing a list of nodes in said circuit with parameters relating to said nodes, a stack unit communicating with said solve unit and storing stacks of nodes in various sets to be operated on by said programmed logic arrays, and a traversal unit communicating with said solve unit and having a gate memory storing a gate list of nodes with pointers to transistors whose gates connect to said nodes, said traversal unit also having a link memory storing a netlist of transistors with parameters relating to said transistors and to connections between nodes and transistors, said traversal unit further comprising a first gate means for addressing said gate list stored in said gate memory and a second gate means for addressing said netlist stored in said link memory, said traversal unit also including a state machine communicating with said solve unit and with said first and second gate means to retrieve gate list and netlist information requested by said programmed logic arrays, said state machine multiplexing said first gate means for addressing said netlist of said link memory during said detection of an unblocked gate to a controlling gate of a pass transistor.

9. The simulator of claim 8 further comprising a timing unit communicating with said solve unit and including a programmed logic array for calculating a cumulated time delay at each node.

10. The simulator of claim 8 further comprising a computer interface controller for communication with said solve unit and with a host computer for loading transistor and node information about an MOS transistor circuit into said simulator and for sending unit delay and timing simulation results to said host computer.

* * * * *